United States Patent
Koila et al.

(10) Patent No.: US 11,418,216 B2
(45) Date of Patent: Aug. 16, 2022

(54) METHOD AND SYSTEM FOR GENERATING PARITY CHECK MATRIX FOR LOW-DENSITY PARITY CHECK CODES

(71) Applicant: Smart IOPS, Inc., Milpitas, CA (US)

(72) Inventors: Shriharsha Koila, Bantwal (IN); Aman Priyadarshi, New Delhi (IN)

(73) Assignee: Smart IOPS, Inc., Milpitas, CA (US)

( * ) Notice: Subject to any disclaimer, the term of this patent is extended or adjusted under 35 U.S.C. 154(b) by 19 days.

(21) Appl. No.: 16/834,310

(22) Filed: Mar. 30, 2020

(65) Prior Publication Data
US 2021/0306004 A1    Sep. 30, 2021

(51) Int. Cl.
  *H03M 13/11* (2006.01)
  *G06F 17/16* (2006.01)
  *H03M 13/03* (2006.01)

(52) U.S. Cl.
  CPC ........... *H03M 13/116* (2013.01); *G06F 17/16* (2013.01); *H03M 13/036* (2013.01); *H03M 13/1157* (2013.01)

(58) Field of Classification Search
  CPC .................................................. H03M 13/116
  See application file for complete search history.

(56) References Cited

U.S. PATENT DOCUMENTS

| | | | | |
|---|---|---|---|---|
| 2005/0289437 A1* | 12/2005 | Oh | ..................... | H03M 13/1148 714/758 |
| 2008/0077843 A1* | 3/2008 | Cho | ................... | H03M 13/1137 714/801 |
| 2008/0270867 A1* | 10/2008 | Chung | ................ | H03M 13/033 714/752 |
| 2009/0106625 A1* | 4/2009 | Jun | ....................... | H04L 1/0057 714/758 |

* cited by examiner

*Primary Examiner* — Joseph D Torres
(74) *Attorney, Agent, or Firm* — Chip Law Group

(57) ABSTRACT

A system for generating a parity check matrix for low-density parity-check (LDPC) codes includes a memory and a processing circuitry that retrieves a base matrix from the memory. The base matrix represents sets of valid and invalid positions for a set of circulant matrices. The processing circuitry determines a value for each valid position based on a heuristic function. The value for each valid position indicates a corresponding circulant matrix of the set of circulant matrices. The processing circuitry replaces each valid position with the corresponding circulant matrix based on the determined value, and each invalid position with a null matrix, to generate the parity check matrix. The parity check matrix thus generated has a high girth and equal distribution of cycles within the parity check matrix.

20 Claims, 7 Drawing Sheets

| | 302 | | | | |
|---|---|---|---|---|---|
| 0 | -1 | -1 | -1 | -2 | -2 |
| -1 | -1 | 0 | -2 | -2 | -1 |
| 0 | -1 | -1 | -2 | -1 | -2 |
| -1 | 0 | -2 | -1 | -2 | -1 |
| -1 | 0 | -1 | -2 | -1 | -2 |
| 0 | -2 | -2 | -1 | -1 | -1 |
| -1 | -1 | -1 | 0 | -2 | -2 |
| -1 | 0 | -2 | -2 | -1 | -1 |
| 0 | -2 | -1 | -1 | -2 | -1 |
| -1 | 0 | -2 | -1 | -1 | -2 |
| 0 | -1 | -1 | -2 | -2 | -1 |
| 0 | -1 | -2 | -1 | -1 | -2 |

FIG. 3

FIG. 5

METHOD AND SYSTEM FOR GENERATING PARITY CHECK MATRIX FOR LOW-DENSITY PARITY CHECK CODES

FIELD OF THE INVENTION

The present invention relates generally to error detection and correction in data storage devices, and more particularly, to a method and system for generating a parity check matrix for low-density parity-check codes in a data storage device.

BACKGROUND

Data integrity is an essential feature for data storage devices, such as flash memory devices. To maintain data integrity, such storage devices implement error correcting codes for correcting erroneous data. An example of such error correcting codes is low-density parity-check (LDPC) codes. An LDPC code is a linear error correcting code that is utilized to correct erroneous data during data transmission. A conventional method for generating a parity check matrix for the LDPC code includes combining (i.e., randomly selecting and placing) a set of circulant matrices in the parity check matrix. Each circulant matrix of the set of circulant matrices is generated by executing one or more shift operations on an identity matrix. However, a selection and a placement of each circulant matrix varies a girth, i.e., a length of a shortest cycle in the parity check matrix, and a distribution of cycles in the parity check matrix. Further, the parity check matrix generated in the aforementioned manner has low girth and uneven distribution of cycles, leading to a reduction in the error correcting capability of the LDPC code. Additionally, as the set of circulant matrices are selected and placed randomly, a significant amount of time is required for optimal positioning of the set of circulant matrices to generate the parity check matrix.

Thus, it would be advantageous to have a parity check matrix for LDPC codes that has high girth and equal distribution of cycles for each length, and solves the above-mentioned problems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 3 is a matrix representation of a base matrix in accordance with an embodiment of the present invention;

FIG. 5 is a matrix representation of the parity check matrix that is generated based on the set of circulant matrices of FIG. 2, the null matrix of FIG. 2, and the base matrix of FIG. 4 in accordance with an embodiment of the present invention;

DETAILED DESCRIPTION

Figure 1:
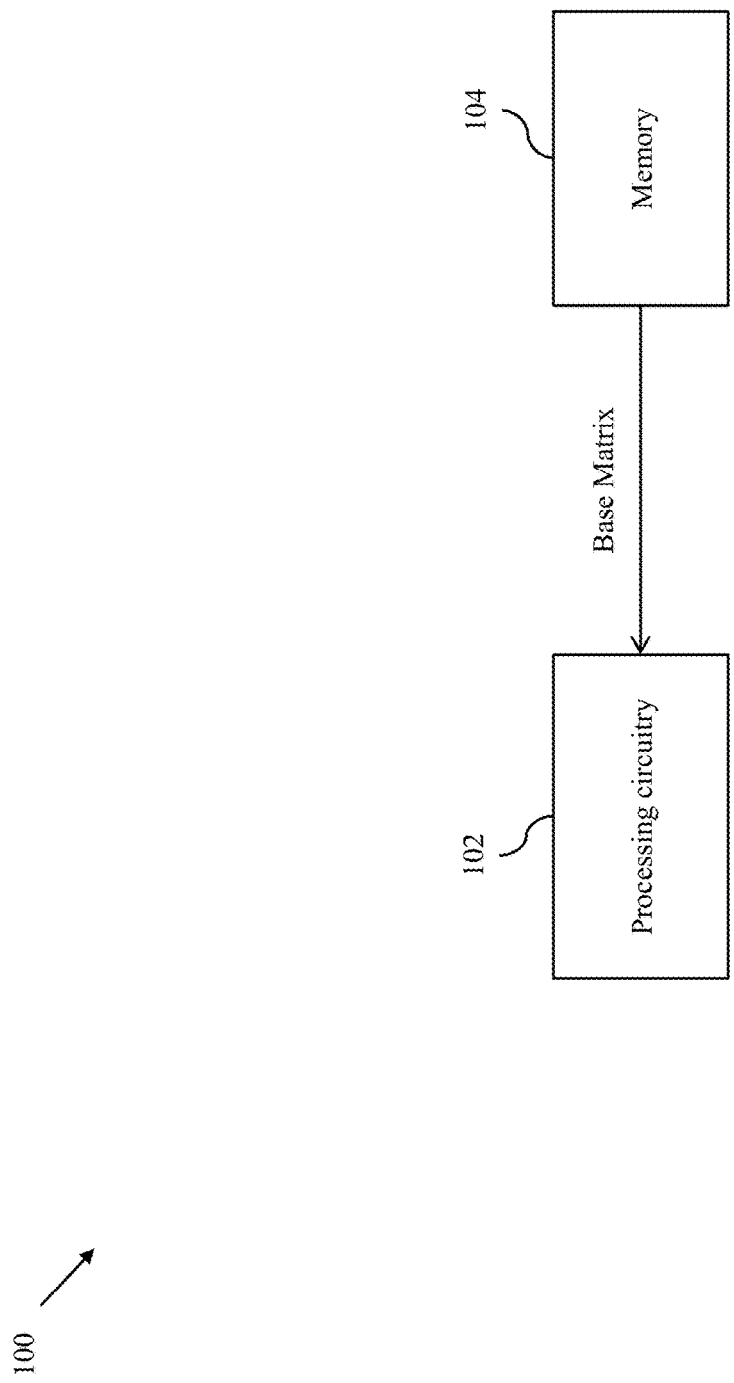
FIG. 1 is a block diagram of a system for generating a parity check matrix for low-density parity-check (LDPC) codes in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment, the present invention provides a system for generating a parity check matrix for low-density parity-check (LDPC) codes. The system includes a processing circuitry that is configured to retrieve a base matrix that represents sets of valid and invalid positions for a set of circulant matrices. The processing circuitry is further configured to determine a value for each valid position. The value for each valid position indicates a corresponding circulant matrix of the set of circulant matrices. The processing circuitry is further configured to replace each valid position with the corresponding circulant matrix based on the value, and each invalid position with a null matrix, to generate the parity check matrix.

In another embodiment, the present invention provides a method for generating a parity check matrix for low-density parity-check (LDPC) codes. The method includes retrieving, by a processing circuitry, a base matrix that represents sets of valid and invalid positions for a set of circulant matrices and determining, by the processing circuitry, a value for each valid position. The value for each valid position indicates a corresponding circulant matrix of the set of circulant matrices. The method further includes replacing, by the processing circuitry, each valid position with the corresponding circulant matrix based on the value, and each invalid position with a null matrix, to generate the parity check matrix.

Various embodiments of the present invention provide a system and a method for generating a parity check matrix for low-density parity-check (LDPC) codes. The system includes a processing circuitry that is configured to retrieve a base matrix. The base matrix represents sets of valid and invalid positions for a set of circulant matrices. The processing circuitry is further configured to determine a value for each valid position based on a heuristic function that is computed based on a number of cycles having a set of lengths that are formed in the parity check matrix. The value for each valid position indicates a corresponding circulant matrix of the set of circulant matrices. The processing circuitry is further configured to replace each valid position with the corresponding circulant matrix based on the value, and each invalid position with a null matrix, to generate the parity check matrix.

The processing circuitry determines the value for each valid position based on the heuristic function. Further, the valid position in the base matrix is replaced with the corresponding circulant matrix to generate the parity check matrix. Thus, a selection and a placement of the set of circulant matrices is such that a girth of the parity check matrix is high and the parity check matrix has equal distribution of cycles of each length compared to a parity check matrix that is generated using conventional techniques.

Further, the base matrix is utilized for generating the parity check matrix which reduces a time required for determining the values for each valid position as compared to random selection and placement of the set of circulant matrices for generating the parity check matrix by conventional techniques. Thus, an efficiency of the system for generating the parity check matrix increases as compared to the conventional techniques.

FIG. 1 is a block diagram of a system 100 for generating a parity check matrix (shown in FIG. 5) for linear error correcting codes, such as low-density parity-check (LDPC) codes in accordance with an embodiment of the present invention. The system 100 may be implemented in data storage devices, such as flash memory devices, for detecting and correcting erroneous data by way of the parity check matrix.

The parity check matrix is a binary matrix, i.e., each element of the parity check matrix is either '1' or '0'. In an example, the parity check matrix includes 'X' rows and 'Y' columns. The parity check matrix is either a regular parity check matrix or an irregular parity check matrix. For a regular parity check matrix, a number of '1's in each row is uniform, i.e., a number of '1's in a single row equals a number of '1' in each of the remaining rows. Further, a number of '1's in each column of the regular parity check matrix is uniform. For an irregular parity check matrix, a number of '1's in each row as well as each column is nonuniform. For the sake of ongoing discussion, it is assumed that the parity check matrix is a regular parity check matrix.

The system 100 includes a processing circuitry 102 and a memory 104. The processing circuitry 102 includes suitable logic and circuitry that is configured to generate the parity check matrix. To generate the parity check matrix, the processing circuitry 102 is configured to execute one or more shift operations on an identity matrix (not shown) to generate a set of circulant matrices (shown in FIG. 2). In an example, the identity matrix includes Q rows and Q columns, thus, the set of circulant matrices includes Q circulant matrices such that each circulant matrix includes Q rows and Q columns. Each shift operation performs a circular shift of elements in each row of the identity matrix.

The processing circuitry 102 is further configured to retrieve a base matrix (shown in FIG. 3) from the memory 104. The base matrix represents sets of valid and invalid positions for the set of circulant matrices. The base matrix includes N rows and M columns. In an example, if N and M are '6' and '12', respectively, the base matrix includes '6' rows and '12' columns. The sets of valid and invalid positions are based on a set of parameters associated with the parity check matrix. The set of parameters include a column weight, a row weight, a number of rows and columns of the base matrix, and a number of rows and columns of each circulant matrix. The column weight and the row weight indicate a number of '1's in each column and each row of the parity check matrix, respectively. In an example, the row weight of the parity check matrix is '6' and the column weight of the parity check matrix is '3'. Thus, for the base matrix with '12' (i.e., N) rows and '6' (i.e., M) columns, each row has '6' (i.e., N-row weight) valid positions and '6' invalid positions, and each column has '3' (i.e., M-column weight) valid positions and '3' invalid positions. The processing circuitry 102 is further configured to identify all such valid and invalid positions, i.e., the sets of valid and invalid positions, in the base matrix.

Based on the identified sets of valid and invalid positions, the processing circuitry 102 is further configured to traverse a graph (not shown) that represents the base matrix to group cycles, i.e., a finite set of edges between a set of nodes, in the graph. The cycles are grouped based on a length of the cycles. The graph is a bipartite graph that includes first and second sets of nodes. The first set of nodes represent parity check equations, i.e., the rows of the base matrix, and the second set of nodes represent code symbols, i.e., the columns of the base matrix. Each cycle in the graph refers to a finite set of connected edges between a first subset of nodes of the first set and a second subset of nodes of the second set such that a start node and an end node of each cycle is the same node. Further, each cycle satisfies a condition that each node except the start node or the end node appears only once in a corresponding cycle. A length of each cycle is a number of edges in the corresponding cycle. In an example, when a number of edges in a cycle is '6', a length of each cycle is '6'.

On grouping the cycles, the processing circuitry 102 determines a set of counts such that each count indicates a number of cycles having the same length. In an example, the set of counts includes a first count that equals 'X', such that 'X' number of cycles have the same length '4'. Similarly, the set of counts include second and third counts that indicate a number of cycles of length '6' and '8', respectively. The processing circuitry 102 determines the set of counts based on equation (1) given below:

$$0 = \Sigma_{i=0}^{|E|/2}(E(2*i) - E(2*i+1)) \pmod{Q} \quad (1)$$

where:
E represents an ordered set of traversed nodes,
i represents an integer,
E(i) represents node value associated with a corresponding circulant matrix, and
Q as described above represents the number of rows and columns of each circulant matrix.

The ordered set of traversed nodes in the graph represents a cycle of an associated length. Further, when the ordered set of traversed nodes satisfies equation (1), a number of cycles, i.e., 'Q' cycles, of a length 'Y' that correspond to the ordered set of traversed nodes are present in the parity check matrix. In an example, if Q is '4' and the length of cycle is '6', thus '4' cycles of length '6' are present in the parity check matrix.

The processing circuitry 102 further determines a value for each valid position in the base matrix based on the set of counts and a pre-defined path weight for each count. The pre-defined path weight for each count is based on a cycle length associated with the set of counts. In an example, a pre-defined path weight for shorter cycles (such as the cycles of length '4') is lower than a pre-defined path weight for longer cycles (such as the cycles of length '6'). The value of each valid position is further determined based on a heuristic function. The heuristic function is computed based on the set of counts and the pre-defined path weight for each count. The value for each valid position is a positive integer or zero that is based on the number of rows and columns of each circulant matrix, i.e., Q, such that the value for each valid position ranges from '0' to 'Q–1'. The processing circuitry 102 computes the heuristic function using equation (2) given below:

$$F = \min_{\forall k \in [0, Q)} (\text{path } 4(k) * w0 + \text{path } 6(k) * w1 + \text{path } 8(k) * w2) \quad (2)$$

where:
F represents the heuristic function, path4, path6, and path8 represent the first through third counts, respectively, k represents the corresponding circulant matrix of the set of circulant matrices, and w0, w1, and w2 represent the pre-defined path weights for the cycles of length '4', '6', and '8', respectively.

The value for each valid position indicates a corresponding circulant matrix of the set of circulant matrices. The processing circuitry 102 replaces each valid position with the corresponding circulant matrix based on the value for each valid position, and each invalid position with a null matrix (shown in FIG. 2), to generate the parity check matrix. The selection and placement of the set of circulant matrices in the base matrix to generate the parity check matrix is such that a girth, i.e., a length of the shortest cycle, of the parity check matrix is high and the cycles of each length are equally distributed in the parity check matrix.

The memory 104 stores the base matrix that is retrieved by the processing circuitry 102 for generating the parity check matrix. Examples of the memory 104 include, but are not limited to, a dynamic random-access memory (DRAM) or static random-access memory (SRAM).

Figure 2:
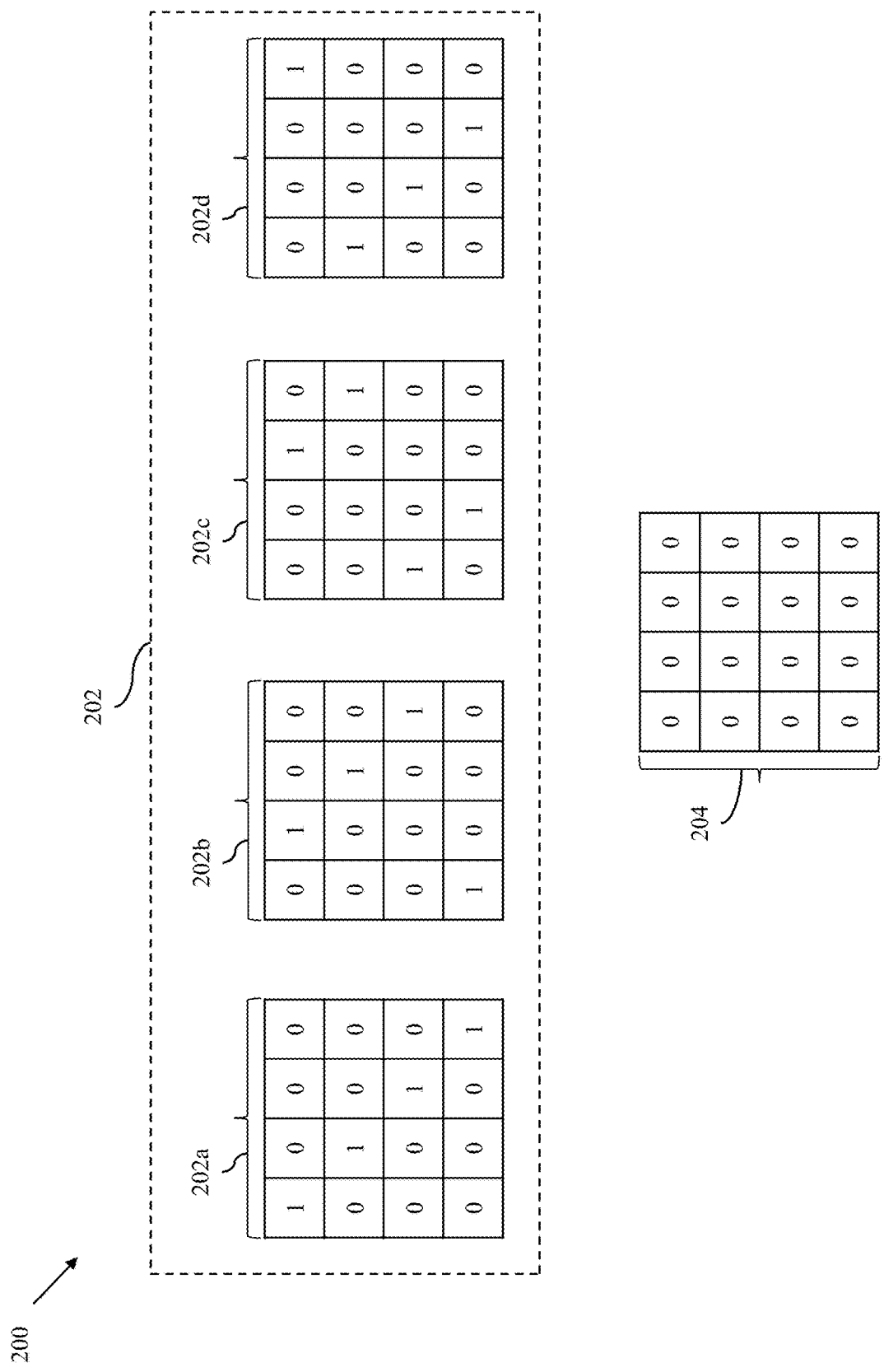
FIG. 2 is a matrix representation of a set of circulant matrices and a null matrix in accordance with an embodiment of the present invention.

FIG. 2 is a matrix representation 200 of the set of circulant matrices (hereinafter designated as, "the set of circulant matrices 202") and the null matrix (hereinafter designated as, "the null matrix 204") in accordance with an embodiment of the present invention. In an example, the set of circulant matrices 202 includes a family of circulant matrices, i.e., first through fourth circulant matrices 202a-202d. Each circulant matrix is a square matrix. An order 'Q' of each circulant matrix, is based on required dimensions of the parity check matrix and is pre-determined. Thus, dimensions of the set of circulant matrices 202 are based on dimensions of the parity check matrix. In the example, if the base matrix has dimensions 6×12 and the required dimensions of the parity check matrix are 24×48, the dimensions of each circulant matrix are 4×4. Thus, each of the first through fourth circulant matrices 202a-202d include Q rows and Q columns.

To generate the first through fourth circulant matrices 202a-202d, the processing circuitry 102 performs one or more shift operations on an identity matrix of order 'Q'. Further, the null matrix 204 includes Q rows and Q columns and each element of the null matrix 204 is '0'.

FIG. 3 is a matrix representation 300 of the base matrix (hereinafter designated as, "the base matrix 302") in accordance with an embodiment of the present invention. In an example, the base matrix 302 includes '6' rows and '12' columns and each element of the base matrix 302 is one of '0', '−1', or '−2'. The elements '0', '−1', and '−2' indicate the set of valid positions that are filled, the set of invalid positions, and the set of valid positions that are unfilled in the base matrix 302, respectively. A filled valid position indicates a position in the base matrix 302 that is pre-filled with a pre-determined value that indicates a corresponding circulant matrix. An unfilled valid position indicates a corresponding position in the base matrix 302 that is filled after the processing circuitry 102 determines the value for the corresponding position.

It will be apparent to a person skilled in the art that although in the current embodiment each element of the base matrix 302 is one of '0', '−1', or '−2', in an alternate embodiment, each element of the base matrix 302 is one of '−1' or '−2' and there are no valid positions that are pre-filled.

Figure 4:
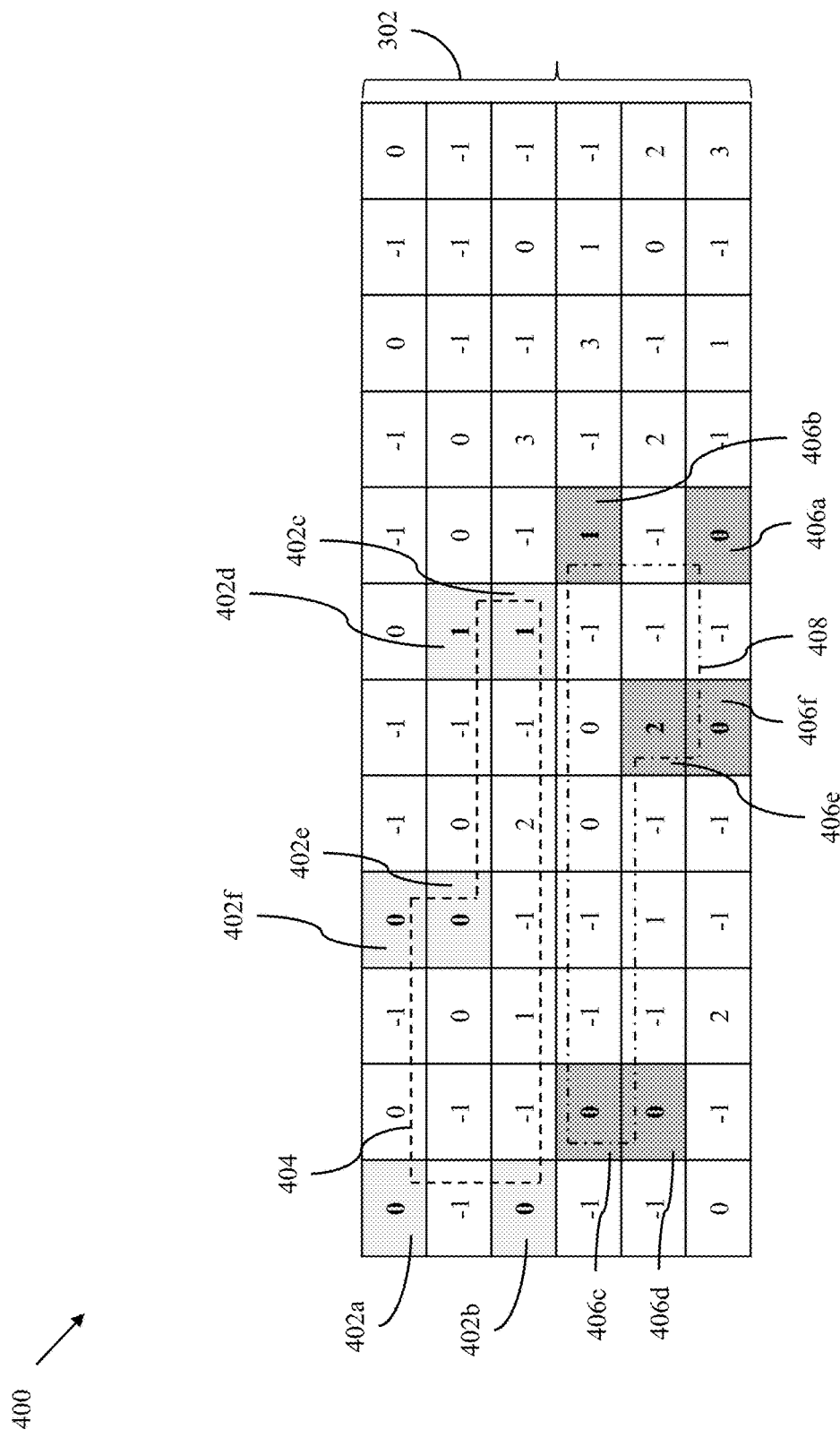
FIG. 4 is a matrix representation of the base matrix of FIG. 3 after determining a value for each valid position in accordance with an embodiment of the present invention.

FIG. 4 is a matrix representation 400 of the base matrix 302 after determining the value for each valid position in accordance with an embodiment of the present invention. The determined value for each unfilled valid position in the base matrix 302 is a positive integer or zero. In the example, as Q is '4', the value for each valid position in the base matrix 302 is one of '0', '1', '2', or '3'. Further, the value for each valid position indicates the corresponding circulant matrix of the set of circulant matrices 202. Thus, the values '0', '1', '2', and '3' correspond to the first through fourth circulant matrices 202a-202d, respectively.

After determining the values of valid positions in the base matrix 302, the processing circuitry 102 traverses a set of nodes in a graph that represents the base matrix 302. In an example, the base matrix 302 includes a first set of nodes 402a-402f that are traversed along a first path 404, i.e., "402a>402b>402c>402d>402e>402f>402a". Each node in the first set of nodes 402a-402f except the start or end node of the first path 404, i.e., a first node 402a, is traversed only once. The first set of nodes 402a-402f satisfies equation (1), and thus four cycles of length '6' are present in the parity check matrix. The base matrix 302 further includes a second set of nodes 406a-406f that are traversed along a second path 408 and do not form a cycle of length '6' in the parity check matrix, as the equation (1) is not satisfied by the second set of nodes 406a-406f.

It will be apparent to a person skilled in the art that the processing circuitry 102 traverses multiple set of nodes that satisfy the equation (1) and thus multiple cycles of different lengths are present in the parity check matrix.

Figure 5:
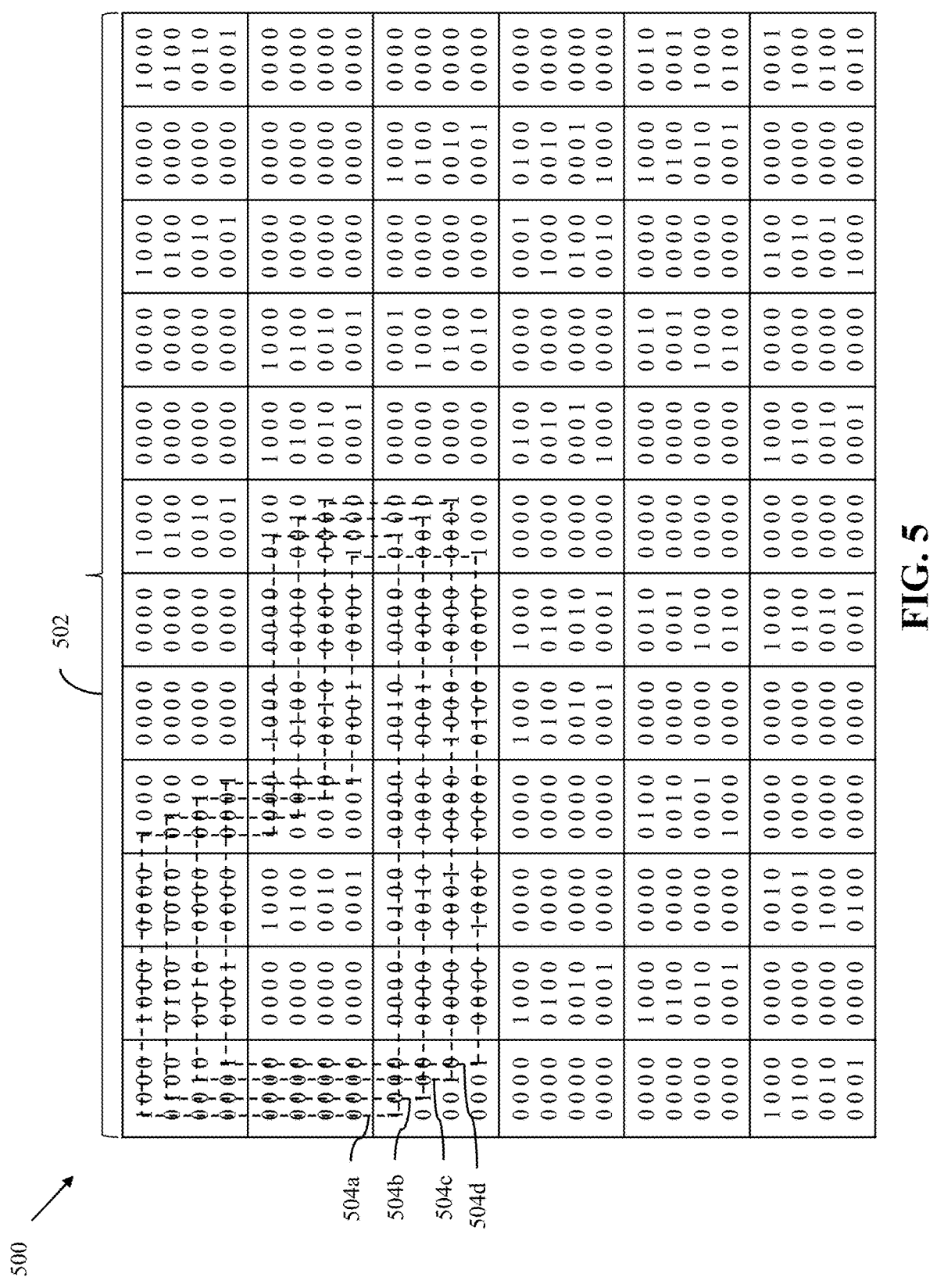

FIG. 5 is a matrix representation 500 of the parity check matrix (hereinafter designated as, "the parity check matrix 502") that is generated based on the set of circulant matrices 202, the null matrix 204, and the base matrix 302 in accordance with an embodiment of the present invention. To generate the parity check matrix 502, the processing circuitry 102 replaces, based on the determined value for each valid position in the base matrix 302, each valid position with the corresponding circulant matrix, and each invalid position with the null matrix 204. Each valid position with the value '0', '1', '2', or '3' in the base matrix 302 is thus replaced with the first circulant matrix 202a, the second circulant matrix 202b, the third circulant matrix 202c, or the fourth circulant matrix 202d. Further, each invalid position illustrated as '−1' is thus replaced with the null matrix 204.

The parity check matrix 502 thus generated includes first through fourth cycles 504a-504d of length '6' due to replacement of the first set of nodes 402a-402f in the base matrix 302 with the corresponding circulant matrices. It will be apparent to a person skilled in the art that the parity check matrix 502 includes multiple cycles of different length due to the replacement of each valid position with the corresponding circulant matrix.

Figure 6:
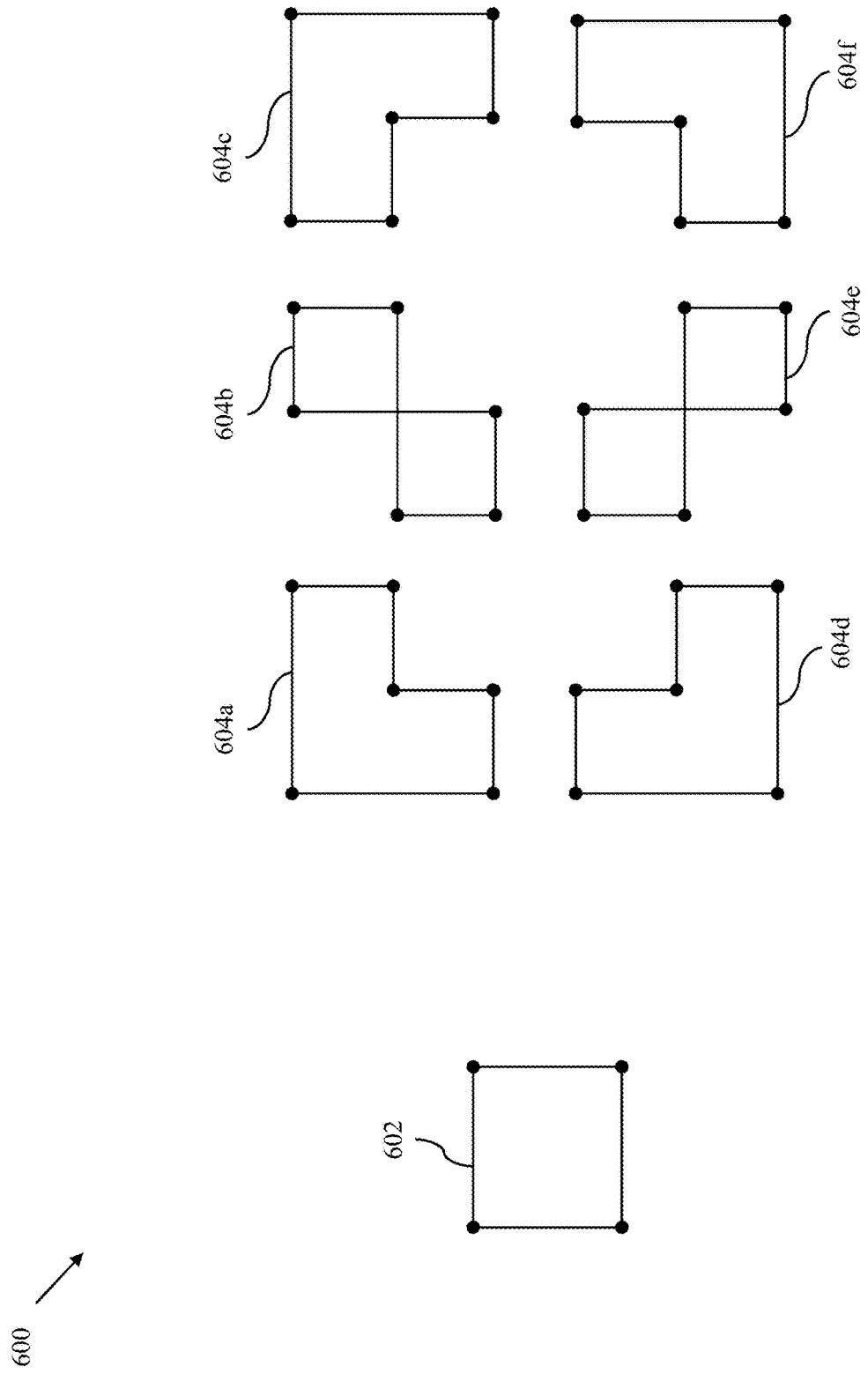
FIG. 6 is an exemplary representation of cycles of the parity check matrix of FIG. 5 in accordance with an embodiment of the present invention.

FIG. 6 is an exemplary representation of cycles 600 of the parity check matrix 502 in accordance with an embodiment of the present invention. The representation of cycles 600 includes a first structure 602 that represents a cycle of length '4' and second through seventh structures 604a-604f that represent cycles of length '6'. The cycles are identified by the processing circuitry 102 while traversing the graph to determine whether a corresponding set of nodes traversed satisfies the equation (1) and forms a cycle, such as a cycle of length '6'.

Figure 7:
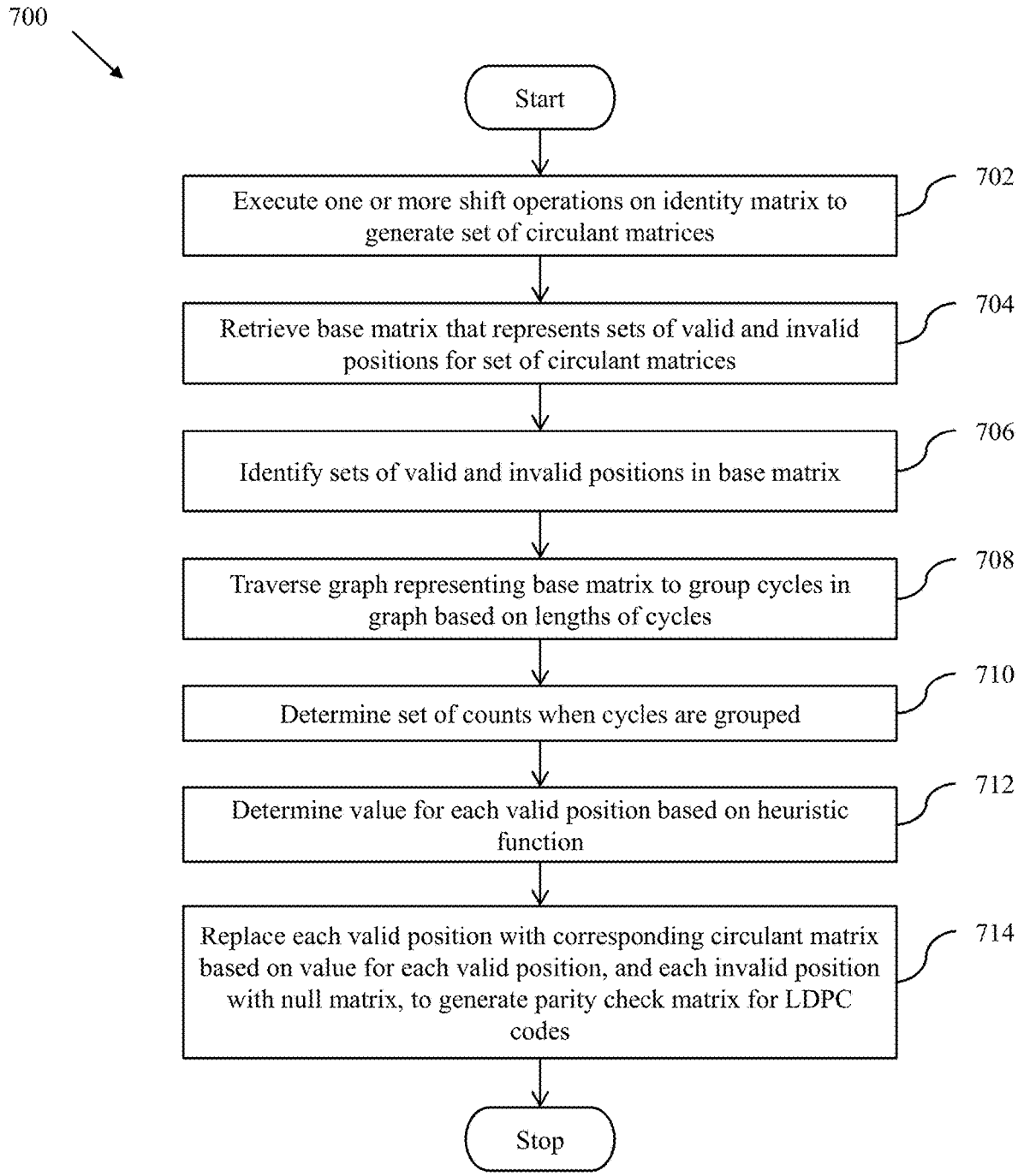
FIG. 7 is a flow chart that illustrates a method for generating the parity check matrix of FIG. 5 for LDPC codes in accordance with an embodiment of the present invention.

FIG. 7 is a flow chart 700 that illustrates a method for generating the parity check matrix 502 for LDPC codes in accordance with an embodiment of the present invention.

At step 702, the processing circuitry 102 executes the one or more shift operations on the identity matrix to generate the set of circulant matrices 202. At step 704, the processing circuitry 102 retrieves the base matrix 302 that represents sets of valid and invalid positions for the set of circulant matrices 202.

At step 706, the processing circuitry 102 identifies the sets of valid and invalid positions in the base matrix 302. The sets of valid and invalid positions are based on the set of parameters associated with the parity check matrix 502. At step 708, the processing circuitry 102 traverses the graph representing the base matrix 302 to group cycles in the graph based on lengths of the cycles.

At step 710, the processing circuitry 102 determines the set of counts when the cycles are grouped. Each count indicates the number of cycles of the same length. At step 712, the processing circuitry 102 determines the value for each valid position based on the heuristic function. The value for each valid position is further determined based on the set of counts and the pre-defined path weight for each length. The value for each valid position indicates the corresponding circulant matrix of the set of circulant matrices 202.

At step 714, the processing circuitry 102 replaces each valid position with the corresponding circulant matrix based on the value for each valid position, and each invalid position with the null matrix 204, to generate the parity check matrix 502.

The processing circuitry 102 determines the value for each valid position based on the heuristic function, the set of counts, and the pre-defined path weight for each length. Further, to generate the parity check matrix 502, each valid position in the base matrix 302 is replaced with the corresponding circulant matrix based on the value for each valid position. Thus, a selection and a placement of the set of circulant matrices 202 is such that a girth of the parity check matrix 502 is high and the parity check matrix 502 has equal distribution of cycles of each length. Further, as the girth of the parity check matrix 502 is high, an error correcting capability of the parity check matrix 502 increases as compared to the conventionally generated parity check matrices. In addition, as the base matrix 302 is utilized for generating the parity check matrix 502, time required to generate the parity check matrix 502 reduces as compared to a conventional technique of randomly selecting and placing circulant matrices to generate a parity check matrix. Thus, the system 100 generates the parity check matrix 502 with an improved efficiency as compared to conventional systems.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for generating a parity check matrix for low-density parity-check (LDPC) codes, the system comprising:
a processing circuitry that is configured to:
retrieve a base matrix that represents a set of valid positions and a set of invalid positions for a set of circulant matrices;
determine a set of counts based on a plurality of cycles, wherein the plurality of cycles are based on the set of valid positions and the set of invalid positions associated with the base matrix, and wherein the set of counts indicates a number of cycles of the plurality of cycles having a same length;
determine a set of pre-defined path weights based on the set of counts, wherein the set of pre-defined path weights is based on a cycle length associated with the set of counts;
determine, based on a heuristic function, a value for each valid position of the set of valid positions that is unfilled, wherein the heuristic function is generated based on the set of counts and the set of pre-defined path weights; and
replace each valid position in the set of valid positions with a corresponding circulant matrix of the set of circulant matrices based on the value that is determined for each valid position in the set of valid positions that is unfilled, and each invalid position in the set of invalid positions with a null matrix, to generate the parity check matrix.

2. The system of claim 1, further comprising:
a memory for storing the base matrix, wherein the processing circuitry retrieves the base matrix from the memory.

3. The system of claim 1, wherein the base matrix includes N rows and M columns, wherein each circulant matrix of the set of circulant matrices and the null matrix include Q rows and Q columns, and wherein the parity check matrix includes N*Q rows and M*Q columns.

4. The system of claim 3, wherein the value for each valid position in the set of valid positions is at least one of a positive integer or zero that is based on at least one of the Q rows and the Q columns, and wherein the value for each valid position is determined based on the heuristic function.

5. The system of claim 3, wherein the processing circuitry is further configured to:
identify the set of valid positions and the set of invalid positions in the base matrix, wherein the set of valid positions and the set of invalid positions are based on a set of parameters associated with the parity check matrix.

6. The system of claim 5, wherein the set of parameters include a column weight, a row weight, a number of rows and columns of the base matrix, and a number of rows and columns of each circulant matrix, and wherein the column weight and the row weight indicate a number of '1's in each column and each row of the parity check matrix, respectively.

7. The system of claim 1, wherein dimensions of the set of circulant matrices are based on dimensions of the parity check matrix.

8. The system of claim 1, wherein the parity check matrix is a binary matrix, and wherein the parity check matrix is either a regular parity check matrix or an irregular parity check matrix.

9. The system of claim 1, wherein the processing circuitry is further configured to:
execute one or more shift operations on an identity matrix to generate the set of circulant matrices.

10. The system of claim 1, wherein the set of valid positions that are filled, indicates positions in the base matrix that is pre-filled with a predetermined value, and wherein the predetermined value indicates the corresponding circulant matrix.

11. The system of claim 1, wherein the cycle length of each cycle of the plurality of cycles is based on a number of edges in a graph representing the base matrix, and wherein the number of edges is based on a first set of nodes of the base matrix and a second set of nodes of the base matrix.

12. The system of claim 11, wherein the first set of nodes indicates a set of rows of the base matrix and the second set of nodes indicates a set of columns of the base matrix.

13. The system of claim 1, wherein the set of counts is based on a node value associated with the corresponding circulant matrix, and a number of rows and a number of columns of each circulant matrix.

14. A method for generating a parity check matrix for low-density parity-check (LDPC) codes, the method comprising:
retrieving, by a processing circuitry, a base matrix that represents a set of valid positions and a set of invalid positions for a set of circulant matrices;
determining, by the processing circuitry, a set of counts based on a plurality of cycles, wherein the plurality of cycles are based on the set of valid positions and the set of invalid positions associated with the base matrix, and wherein the set of counts indicates a number of cycles of the plurality of cycles having a same length;
determining, by the processing circuitry, a set of pre-defined path weights based on the set of counts, wherein the set of pre-defined path weights is based on a cycle length associated with the set of counts;
determining, by the processing circuitry, based on a heuristic function, a value for each valid position of the set of valid positions that is unfilled, wherein the heuristic function is generated based on the set of counts and the set of pre-defined path weights; and
replacing, by the processing circuitry, each valid position in the set of valid positions with a corresponding circulant matrix of the set of circulant matrices based on the value that is determined for each valid position that is unfilled, and each invalid position in the set of invalid positions with a null matrix, to generate the parity check matrix.

15. The method of claim 14, wherein the base matrix includes N rows and M columns, wherein each circulant matrix of the set of circulant matrices and the null matrix includes Q rows and Q columns, and wherein the parity check matrix includes N*Q rows and M*Q columns.

16. The method of claim 15, wherein the value for each valid position in the set of valid positions is at least one of a positive integer or zero that is based on at least one of the Q rows and the Q columns, and wherein the value for each valid position is determined based on the heuristic function.

17. The method of claim 15, further comprising:
identifying, by the processing circuitry, the set of valid positions and the set of invalid positions in the base matrix, wherein the set of valid positions and the set of invalid positions are based on a set of parameters associated with the parity check matrix.

18. The method of claim 17, wherein the set of parameters include a column weight, a row weight, a number of rows and columns of the base matrix, and a number of rows and columns of each circulant matrix, and wherein the column weight and the row weight indicate a number of '1's in each column and each row of the parity check matrix, respectively.

19. The method of claim 14, wherein the parity check matrix is a binary matrix, and wherein the parity check matrix is either a regular parity check matrix or an irregular parity check matrix.

20. The method of claim 14, further comprising, executing, by the processing circuitry, one or more shift operations on an identity matrix to generate the set of circulant matrices.

* * * * *